United States Patent

Abe et al.

[11] Patent Number: 5,474,022
[45] Date of Patent: Dec. 12, 1995

[54] DOUBLE CRUCIBLE FOR GROWING A SILICON SINGLE CRYSTAL

[75] Inventors: Keisei Abe; Hisashi Furuya; Norihisa Machida; Yoshiaki Arai, all of Saitama, Japan

[73] Assignees: Mitsubishi Materials Corporation; Mitsubishi Materials Silicon Corporation, both of Tokyo, Japan

[21] Appl. No.: 420,350

[22] Filed: Apr. 11, 1995

[30] Foreign Application Priority Data

Apr. 21, 1994 [JP] Japan ................................. 6-083448

[51] Int. Cl.$^6$ ............................................. C30B 35/00
[52] U.S. Cl. ............................ 117/214; 117/31; 117/213
[58] Field of Search ................................. 117/13, 18, 19, 117/31, 33, 213, 214

[56] References Cited

U.S. PATENT DOCUMENTS

| | | | |
|---|---|---|---|
| 4,203,951 | 5/1980 | Goriletsky et al. | 117/213 |
| 4,352,784 | 10/1982 | Lin | 117/213 |
| 5,030,315 | 7/1993 | Washizuka et al. | 117/18 |
| 5,279,798 | 1/1994 | Kaneto et al. | 117/213 |

FOREIGN PATENT DOCUMENTS 2278188  12/1987  Japan ................................. 117/213

*Primary Examiner*—R. Bruce Breneman
*Assistant Examiner*—Felisa Garrett
*Attorney, Agent, or Firm*—McAulay Fisher Nissen Goldberg & Kiel

[57] ABSTRACT

There is provided a double crucible for growing a silicon single crystal in which the partition wall 17 in the shape of ring is concentric with the main crucible 6 in the shape of bottomed cylinder and the lower end of the partition wall 17 is fixed on the inner bottom of the main crucible, and thus the outer crucible 18 and the inner crucible 19 are formed inside the main crucible. The partition wall 17 is uniform in thickness and has introducing holes 20 in its lower part which link the outer crucible with the inner crucible. The partition wall is made so that the inner diameter of its lower part may be smaller than the inner diameter of its upper part. Supposing that A is the diameter of the partition wall at a level of molten silicon, h is a depth from the surface of the molten silicon to the introducing holes, V(out) is an amount of molten silicon stored in the outer crucible, and V(in) is an amount of molten stored in the inner crucible, the relation of D/A=1.5 to 3, 2h/A>1, and V(out)/V(in)=0.4 to 0.9, is satisfied. The invention reduces the number of coarse COPs of 0.3 um or greater in diameter generated after Sc-1 cleaning on the surface of a silicon wafer made of a single crystal bar grown without making larger in size the furnace of a silicon single crystal continuously growing apparatus.

10 Claims, 5 Drawing Sheets

DOUBLE CRUCIBLE FOR GROWING A SILICON SINGLE CRYSTAL

BACKGROUND OF THE INVENTION

1. Field of the Invention

The present invention relates to a double crucible for growing a silicon single crystal which is made of double structure by disposing a ring-shaped partition wall having introducing through-holes at its lower part inside it.

More particularly, it relates to a double crucible capable of growing a silicon single crystal having few micro-defects 0.3 μm or more in diameter which are called Crystal Originated "Particles" (COP) in case of being used in a silicon single crystal continuous pulling and growing apparatus.

2. Description of the Prior Art

A silicon single crystal continuously growing furnace using the so-called CZ method which grows a high purity silicon single crystal for semiconductor from molten silicon inside the inner crucible while resupplying the silicon and dopant which are consumed for this growth from the outer crucible into the inner crucible is known.

On the other hand, a silicon single crystal growing apparatus of batch type has a demerit that such quality as concentration of oxygen, crystal growth interface and concentration of dopants in a single crystal bar varies in the longitudinal direction since an amount of molten silicon inside the quartz crucible varies with growth of the single crystal. The silicon single crystal continuously growing apparatus does not have such demerit but has a merit of high productivity.

In the continuously growing furnace, as shown in FIG. 7, a heat insulator 2 and a heater 3 are disposed concentrically with furnace 1 inside, a main quartz crucible 6 in the shape of bottomed cylinder is engaged with a graphite susceptor 4 fixed on the upper end of a rotatory shaft 5 in the middle of the furnace 1. The lower end of a partition wall 7 in the shape of ring concentrically with the main crucible 6 is fixed on the inner bottom of the main crucible 6. The ring-shape partition wall 7 is provided in the direction of vertical line. An outer crucible 8 and an inner crucible 9 for respectively storing molten silicon M are formed by the main crucible 6 and the partition wall 7. Plural introducing holes 10 and 10 for connecting the outer crucible 8 to the inner crucible 9 are provided at the lower part of the partition wall 7. The molten silicon M in the outer crucible 8 which has been molten by the heater 3 can move from the outer crucible 8 to the inner crucible 9 through the introducing holes 10. A rotatory lifting mechanism 11 is provided above the top of the furnace body 1 and a seed S suspended with a wire 12 from the rotary lifting mechanism 11 disposed above the main crucible 6, The rotary lifting mechanism 11 is made so as to grow a high purity silicon single crystal at the lower end of a single crystal bar T grown from the seed S by lifting the single crystal bar T while rotating it.

In order to resupply materials of the single crystal which have been consumed for this growth, high purity polycrystalline silicon grains and a specified amount of dopant are supplied to the outer crucible 8 from a material feeding mechanism 13 provided outside the furnace 1 through a chute 14 bored through the wall of the furnace 1. These materials become high purity molten silicon after being molten by sensible heat of the molten silicon M inside the outer crucible. The molten silicon flows into the inner crucible 9 through the introducing holes 10 of the partition wall 7 as being accompanied with a specified concentration of dopant, is mixed with the molten silicon M stored in the inner crucible 9, and maintains the molten silicon containing a specified concentration of dopant. A silicon single crystal having the dopant of desired concentration is grown and lifted from the molten silicon.

A silicon wafer cut from the single crystal bar lifted by the continuously growing apparatus is polished and then generally is cleaned by the so-called SC-1 cleaning process using a cleaning solution made of $NH_4OH$, $H_2O_2$, and $H_2O$ on the basis of the standard RCA method. This SC-1 cleaning solution removes organic contaminants and metal impurities forming part of particles by a strong oxidizing action of $H_2O_2$ and a solving action and compound producing reaction of $NH_4OH$.

Recently, shallow etch pits have been observed after the SC-1 cleaning and various papers have been presented which consider that the etch pits are caused by hole clusters introduced during the crystal growth (for example, J. Ryuta et al., "Crystal-originated singularities on Si wafer surface after SC1 cleaning", Jpn. J. Appl. Phys., 29, L1947–L1949 and T. Abe et al., "Behavior of point defects in FZ silicon crystals", Semiconductor Silicon 1990, pp. 105–116 Electrochem. Society (1990). The above-mentioned etch pits are detected by counting them by means of a laser particle counter on the market. The etch pits counted as particles are called Crystal Originated "Particles" (COP).

In case of continuously growing a silicon single crystal by means of the prior art, although the quality of the single crystal is good without varying in the longitudinal direction of the crystal bar as mentioned above, a ratio ($V_{OUT}/V_{IN}$) of an amount of molten silicon stored in the outer crucible ($V_{OUT}$) to an amount of molten silicon stored in the inner crucible ($V_{IN}$) is 0.3 or so in the double crucible shown in FIG. 7, and therefore it has been desired that the heat capacity of the outer crucible is made large enough for the molten silicon in the outer crucible to heat the molten silicon in the inner crucible. Due to the insufficient heat capacity of the crucible, in case of making a silicon wafer by lifting a silicon single crystal by means of the above-mentioned double crucible, generation of COP of 0.3 μm or greater in diameter has been unavoidable on the silicon wafer polished and cleaned by means of the SC-1 cleaning. Although the cause of this has not been made fully clear, it is thought that the cause is the above-mentioned insufficient heat capacity.

In order to increase the ratio of $V_{OUT}/V_{IN}$, it is thought to increase the capacity of the outer crucible. In this case, when the capacity of the inner crucible is not changed, the main crucible is increased in the radial direction of it and at the same time the heater and the heat insulator need to be made greater in capacity and as a result the furnace has been made larger in size. In case of increasing $V_{OUT}/V_{IN}$ by making the upper inner diameter of the partition wall 7 smaller than the lower inner diameter of the partition wall 7, as shown in FIGS. 8 to 10, without changing the size of the main crucible, in other words, without increasing an amount of molten silicon in the main crucible, D/A is made so small as 1.2 and therefore there has been a demerit that it is hard to keep the crystal growth, supposing that A is the diameter of a silicon single crystal being grown and D is the inner diameter of the above-mentioned partition wall at a level of the molten silicon.

On the other hand, in recent years semiconductor integrated circuits have been made remarkably highly integrated, and with this trend circuits made on a silicon wafer are also made finer. And in case of using a wafer having COP

SUMMARY OF THE INVENTION

An object of the invention is to provide a double crucible for growing silicon single crystal which makes few generation of coarse COPs of 0.3 μm or greater in diameter after the SC-1 cleaning on the surface of a silicon wafer made of a single crystal bar grown without making larger the furnace of a silicon single crystal continuously growing apparatus.

As a result of a study which the inventors have made particularly focusing on a double crucible of a single crystal growing furnace in order to grow a single crystal having few coarse COPs from the above-mentioned viewpoint, the inventors have succeeded in continuously growing a single crystal having few micro-defects by making smaller the inner diameter of the tower part of the partition wall for forming the double crucible than the inner diameter of the upper part of it.

The invention provides a double crucible for growing a silicon single crystal which has been improved by providing a main crucible 6 in the shape of bottomed cylinder, as shown in FIGS. 1 and 6, a partition wall 17 in the shape of ring which is disposed concentrically with the main crucible 6 and whose lower end is fixed on the inner bottom of the main crucible 6, an outer crucible 18 and an inner crucible 19 which are composed of the main crucible 6 and the partition wall 17 and respectively store molten silicon in them, and plural introducing holes 20 and 20 which are made in the lower part of the partition wall 17 to link the outer crucible 18 with the inner crucible 19.

The invention provides characteristics in which the partition wall 17 is uniform in thickness and the inner diameter the lower part of the partition wall 17 is made smaller than the inner diameter of the upper part of it and the relation shown by the following expressions (1) to (3) is satisfied, $$D/A = 1.5 \text{ to } 3.0 \qquad (1)$$

$$2h/A \geq 1 \qquad (2)$$

$$V_{OUT}/V_{IN} = 0.4 \text{ to } 0.9 \qquad (3)$$

where A is the diameter of a silicon single crystal bar T being grown, D is the inner diameter of the partition wall at a level of molten silicon, h is a depth from the surface of the molten silicon to the introducing holes 20, $V_{OUT}$ is an amount of molten silicon stored in the outer crucible 18, and $V_{IN}$ is an amount of molten silicon stored in the inner crucible 19. The reason why D/A is limited to D/A=1.5 to 3.0 is that D/A which is less than 1.5 makes it difficult to keep the crystal growth and D/A which is greater than 3.0 makes more a necessary amount of molten silicon and so makes the production system more uneconomical. The reason why 2h/A is limited to 2h/A≧1 is that a depth to the introducing holes which is less than the radius of the silicon single crystal bar causes varied concentration of dopant in the silicon single crystal. The reason why $V_{OUT}/V_{IN}$ is limited to $V_{OUT}/V_{IN}$=0.4 to 0.9 is that $V_{OUT}/V_{IN}$ which is less than 0.4 does not increase the heat capacity enough for the molten silicon in the above-mentioned outer crucible to heat the molten silicon in the inner crucible and therefore generates coarse COPs of 0.3 μm or more in diameter on the polished silicon wafer after the SC-1 cleaning, and $V_{OUT}/V_{IN}$ which is greater than 0.9 makes the amount of molten silicon increased, and the system less economical.

In an example shown in FIG. 1, the partition wall 17 is formed inclined so that its inner diameter may gradually become smaller toward the lower end of it. The partition wall 17 of the invention is not particularly limited in its shape as long as it is concentrical with the main crucible 6. For example, it may be circular concentrically with the main crucible 6 as shown in FIG. 4 or oval concentrically with the main crucible 6 as shown in FIG. 5. Although not shown, it may be also a square tube.

In another double crucible of the invention, as shown in FIGS. 2 and 3, the partition wall 17 is composed of the vertical upper part 17a, the vertically lower part 17b whose inner diameter is smaller than that of the vertical upper part 17a, and the intermediate part 17c connecting the lower end part of the vertically upper part 17a and the upper end part the vertically lower part 17b with each other through it. The intermediate part 17c shown in FIG. 2 is horizontally formed and the intermediate part 17c shown in FIG. 3 is formed inclined so that its inner diameter may gradually become smaller toward the vertically lower part 17b.

And it is to be desired that the double crucible of the invention satisfies the relation shown by the following expression (4) in addition to the above-mentioned expressions (1) to (3), $$d/D = 0.3 \text{ to } 0.6 \qquad (4)$$

where d is the inner diameter of the partition wall 17 at the position where the introducing holes 20 are provided. The reason why d/D is limited within a range from 0.3 to 0.6 is that when d/D is less than 0.3 it is hard to keep growing a crystal and d/D which is greater than 0.6 does not increase so much the heat capacity of molten silicon in the outer crucible for heating molten silicon in the inner crucible as mentioned above and so does not have an effect enough to prevent generation of COP. And it is preferable that the plural introducing holes 20 are provided at a level equal to one another from the inner bottom of the main crucible 6.

DESCRIPTION OF THE PREFERRED EMBODIMENT

Embodiments of the invention are described together with comparative examples in the following.

(Embodiments 1 to 4)

Figure 1:
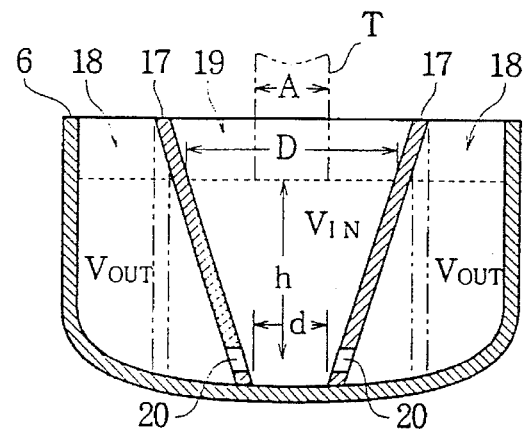
FIG. 1 is a rough cross-sectional view of a double crucible of the invention.
Figure 2:
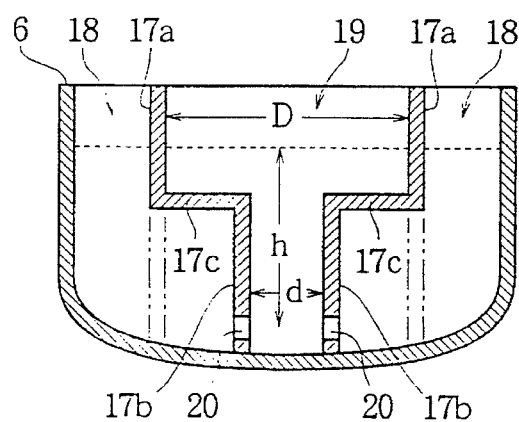
FIG. 2 is a rough cross-sectional view of another double crucible of the invention.
Figure 3:
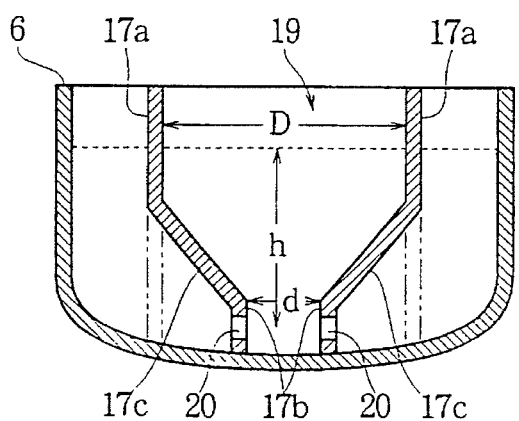
FIG. 3 is a rough cross-sectional view of still another double crucible of the invention.
Figure 4:
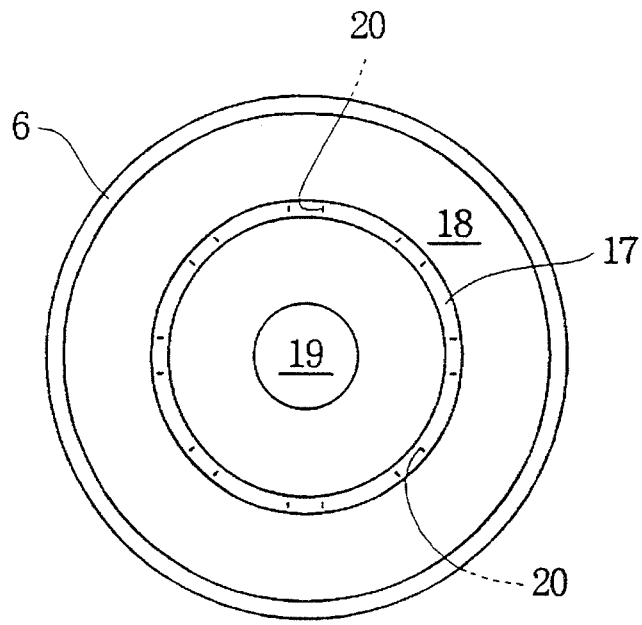
FIG. 4 is a plan view of the double crucible shown in FIG. 1.
Figure 5:
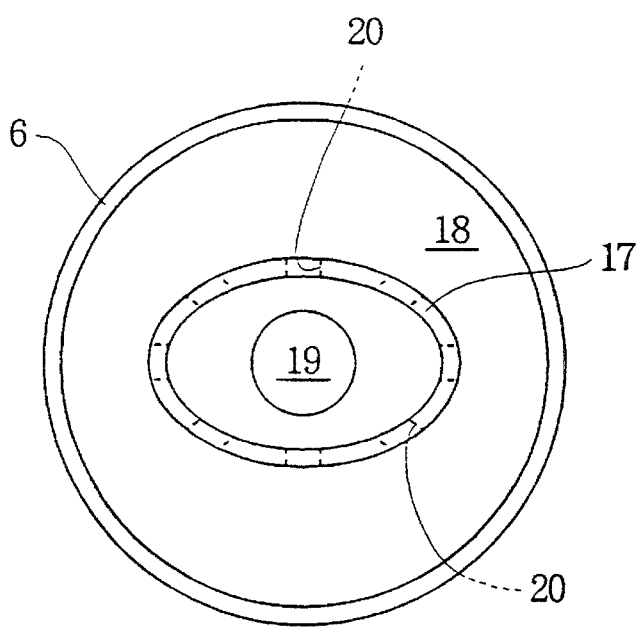
FIG. 5 is a plan view of the double crucible shown in FIG. 2

Double crucibles of embodiments 1, 2, 3, and 4 which had the shape shown in FIG. 3 and had respectively a partition wall having dimensions shown in Table 1 were provided.

(Comparative examples 1 and 2)

Figure 7:
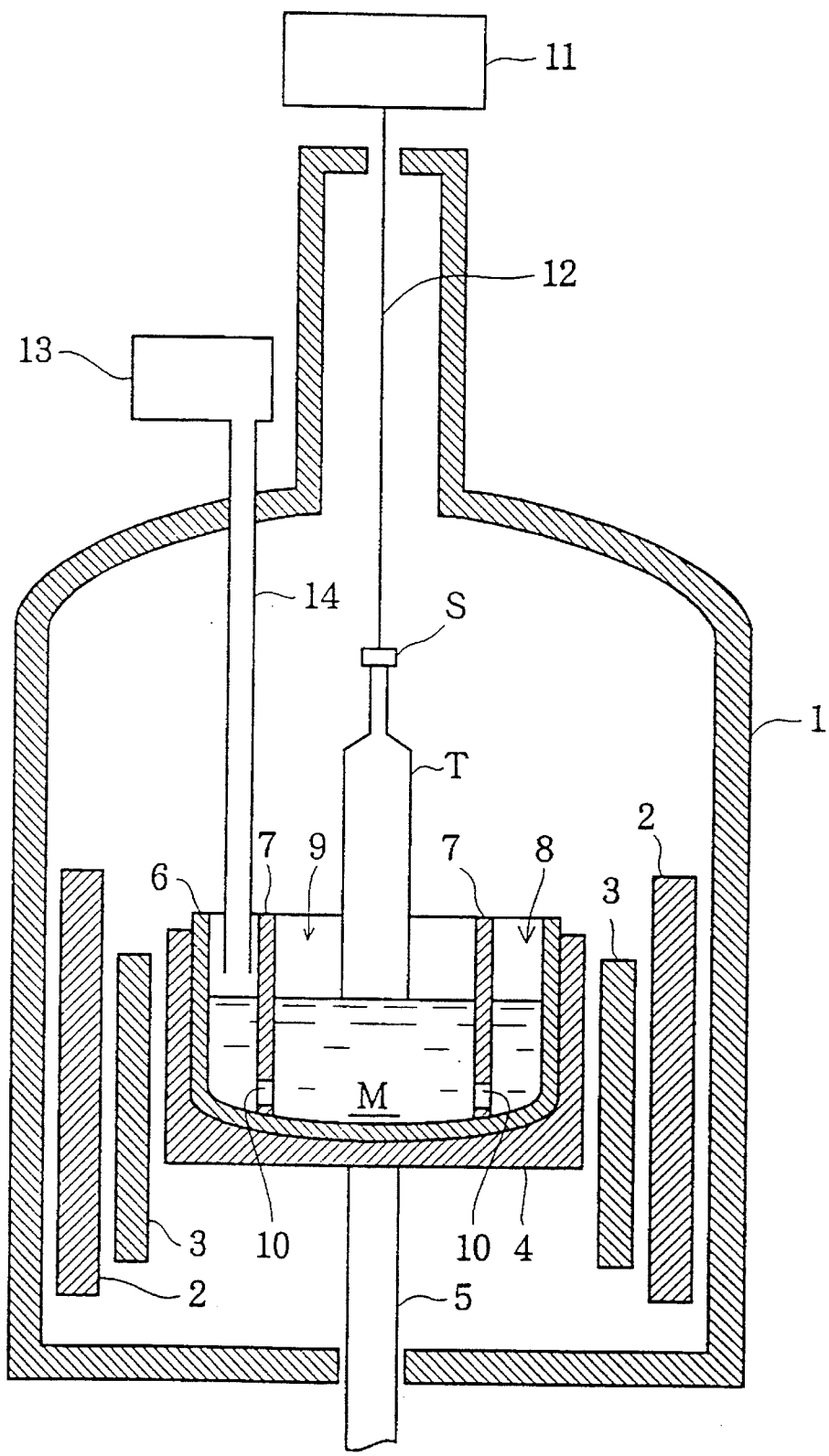
FIG. 7 is a rough cross-sectional view of a single crystal continuously growing apparatus by means of the CZ method using a double crucible of the prior art.
Figure 8:
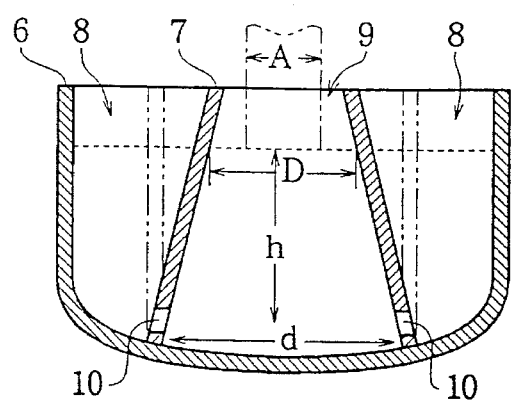
FIG. 8 is a rough cross-sectional view of a double crucible of the prior art.
Figure 9:
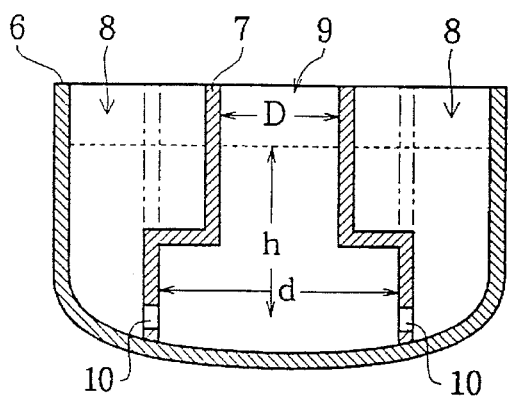
FIG. 9 is a rough cross-sectional view of another double crucible of the prior art.
Figure 10:
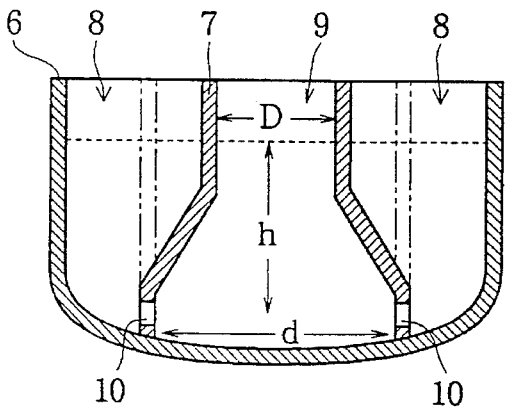
FIG. 10 is a rough cross-sectional view of still another double crucible of the prior art.

Double crucibles of comparative examples 1 and 2 which had the shape shown in FIG. 7 and had respectively a partition wall having dimensions shown in Table 1 were provided.

(Comparison test)

Figure 6:
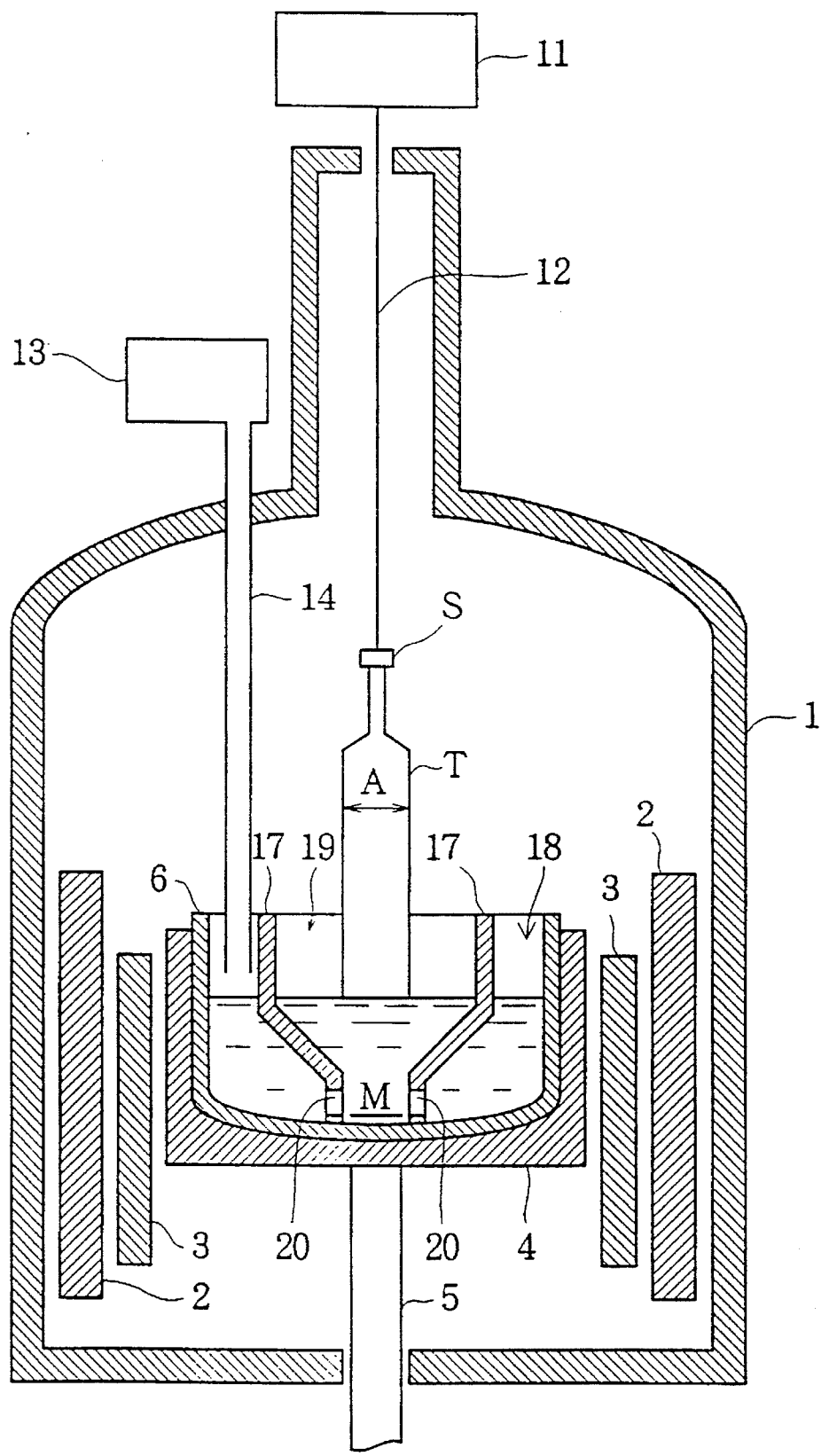
FIG. 6 is a rough cross-sectional view of a single crystal continuously growing apparatus by means of the CZ method using a double crucible of the invention.

Under the following same conditions, a silicon single crystal of 1,000 mm in total length was grown by means of each of the single crystal growing apparatus shown in FIG. 6 in which each of the double crucibles of the embodiments 1 to 4 was mounted and the single crystal growing apparatus shown in FIG. 7 in which each of the double crucibles of the comparative examples 1 and 2 was mounted.

Depth from the surface of molten silicon to the introducing holes (h): 100 mm

Diameter of a silicon single crystal bar (A): 160 mm

An amount of molten silicon in the main crucible: 32 kg

Crystal growth rate: 1.2 mm/minute

A silicon wafer was cut from a high purity silicon single crystal bar grown in a manner such as this, at the position 500 mm down from its top and the surface of it was polished and then cleaned for 20 minutes at 85° C. by means of the SC-1 cleaning solution which contains ammonia water, hydrogen peroxide water, and ultrapure water at a ratio of 1:1:5. After this, the number of COPs of 0.3 μm or greater in diameter on the surface of the wafer was counted by means of a laser particle counter commercially available. The result of this measurement is shown in Table 1.

TABLE 1

| | Inner diameter of main crucible | D (mm) | d (mm) | d/D | h (mm) | 2h/A | Number of COPs (particles/cm$^2$) |
| --- | --- | --- | --- | --- | --- | --- | --- |
| Embodiment 1 | 539 | 386 | 136 | 0.35 | 125 | 1.56 | 5 |
| Embodiment 2 | " | 386 | 212 | 0.55 | 100 | 1.25 | 3 |
| Embodiment 3 | " | 340 | 111 | 0.33 | 125 | 1.56 | 4 |
| Embodiment 4 | " | 340 | 136 | 0.40 | 100 | 1.25 | 3 |
| Comparative example 1 | 539 | 386 | 396 | 1 | 100 | 1.25 | 50 |
| Comparative example 2 | " | 340 | 340 | 1 | 100 | 1.25 | 40 |

As it is apparent from Table 1, while the number of COPs of 0.3 μm or greater in diameter on the silicon wafer which was made by means of each of the double crucibles of the comparative examples 1 and 2 and cleaned by means of the SC-1 cleaning was 40 to 50 particles/cm$^2$, the number of COPs of 0.3 μm or greater in diameter on the silicon wafer which was made by means of each of the double crucibles of the embodiments 1 to 4 and cleaned by means of the SC-1 cleaning was very few as 3 to 5 particles/cm$^2$, namely, equal to or less than 1/10 of the former.

As described above, according to the invention, since the heat capacity of the outer crucible can be made greater as compared with that of the inner crucible without making larger the outer crucible in its radial direction, it is possible to reduce the number of coarse COPs of 0.3 μm or greater in diameter generated after SC-1 cleaning on the surface of a silicon wafer made of a single crystal bar grown without making larger in size the furnace body of a silicon single crystal continuously grooving apparatus. As a result, a silicon wafer made by means of a double crucible of the invention becomes suitable for a highly integrated circuit.

What is claimed is:

1. A double crucible for growing a silicon single crystal, comprising;

a main crucible (6) in the shape of bottomed cylinder, a partition wall (17) in the shape of ring which is concentric with the main crucible (6) and whose lower end is fixed on the inner bottom of the main crucible (6), an outer crucible (18) and an inner crucible (19) which are composed of the main crucible (6) and the partition wall (17) and respectively store molten silicon (M) in them, and plural introducing holes (20 and 20) which are made in the lower part of the partition wall (17) and link the outer crucible (18) with the inner crucible (19), wherein the partition wall (17) is uniform in thickness and the inner diameter of the lower part of the partition wall (17) is made smaller than the inner diameter of the upper part of the partition wall (17), and the relation shown by the following expressions (1) to (3) is satisfied, $$D/A = 1.5 \text{ to } 3.0 \quad (1)$$

$$2h/A \geq 1 \quad (2)$$

$$V_{OUT}/V_{IN} = 0.4 \text{ to } 0.9 \quad (3)$$

where A is the diameter of a grown silicon single crystal bar (T), D is the inner diameter of the partition wall (17) at a level of the surface of molten silicon, h is a depth from the surface of the molten silicon to the introducing holes (20), $V_{OUT}$ is an amount of molten silicon stored in the outer crucible (18), and $V_{IN}$ is an amount of molten silicon stored in the inner crucible (19).

2. The double crucible for growing silicon single crystal as defined in claim 1, wherein the partition wall (17) is formed inclined so that its inner diameter may gradually become smaller toward its lower end.

3. The double crucible for growing a silicon single crystal as defined in claim 2, wherein in addition to the relation shown by the expressions (1) to (3), the relation shown by the following expression (4) is satisfied, $$d/D = 0.3 \text{ to } 0.6 \quad (4)$$

where d is the inner diameter of the partition wall (17) at the position where the introducing holes (20) are provided.

4. The double crucible for growing a silicon single crystal as defined in claim 1, wherein the partition wall (17) is composed of the vertically upper part (17a), the vertically lower part (17b) whose inner diameter is smaller than the inner diameter of the vertically upper part (17a), and the intermediate part (17c) which connects the lower end of the vertically upper part (17a) and the upper end of the vertically lower part (17b) with each other through it.

5. The double crucible for growing a silicon single crystal as defined in claim 4, wherein the intermediate part (17c) is formed horizontally.

6. The double crucible for growing a silicon single crystal as defined in claim 5, wherein in addition to the relation shown by the expressions (1) to (3), the relation shown by the following expression (4) is satisfied, $$d/D = 0.3 \text{ to } 0.6 \qquad (4)$$

where d is the inner diameter of the partition wall (17) at the position where the introducing holes (20) are provided.

7. The double crucible for growing a silicon single crystal as defined in claim 4, wherein the intermediate part (17c) is formed inclined so that its inner diameter may gradually become smaller toward the vertically lower part (17b).

8. The double crucible for growing a silicon single crystal as defined in claim 7, wherein in addition to the relation shown by the expressions (1) to (3), the relation shown by the following expression (4) is satisfied, $$d/D = 0.3 \text{ to } 0.6 \qquad (4)$$

where d is the inner diameter of the partition wall at the position where the introducing holes (20) are provided.

9. The double crucible for growing a silicon single crystal as defined in claim 4, wherein in addition to the relation shown by the expressions (1) to (3), the relation shown by the following expression (4) is satisfied, $$d/D = 0.3 \text{ to } 0.6 \qquad (4)$$

where d is the inner diameter of the partition wall (17) at the position where the introducing holes (20) are provided.

10. The double crucible for growing a silicon single crystal as defined in claim 1, wherein in addition to the relation shown by the expressions (1) to (3), the relation shown by the following expression (4) is satisfied, $$d/D = 0.3 \text{ to } 0.6 \qquad (4)$$

where d is the inner diameter of the partition wall (17) at the position where the introducing holes (20) are provided.

* * * * *